US012774880B2

(12) United States Patent
Schmitt et al.

(10) Patent No.: US 12,774,880 B2
(45) Date of Patent: Oct. 27, 2026

(54) MAGNETIC SENSOR SYSTEM

(71) Applicant: Analog Devices International Unlimited Company, Limerick (IE)

(72) Inventors: Jochen Schmitt, Biedenkopf (DE); Enda Nicholl, Kilmallock (IE); Christian Nau, Marburg (DE)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 164 days.

(21) Appl. No.: 18/067,869

(22) Filed: Dec. 19, 2022

(65) Prior Publication Data

US 2023/0194237 A1 Jun. 22, 2023

Related U.S. Application Data

(60) Provisional application No. 63/265,722, filed on Dec. 20, 2021.

(51) Int. Cl.
*G01B 7/30* (2006.01)
*G01D 5/14* (2006.01)
(Continued)

(52) U.S. Cl.
CPC ............... *G01B 7/30* (2013.01); *G01D 5/145* (2013.01); *G01D 5/2451* (2013.01); *G01R 33/07* (2013.01);
(Continued)

(58) Field of Classification Search
CPC .... G01B 7/30; G01R 33/0283; G01R 33/038; G01R 33/07; G01R 33/093; G01R 33/096;
(Continued)

(56) References Cited

U.S. PATENT DOCUMENTS 4,951,048 A * 8/1990 Ichikawa ............ F15B 15/2846 341/15
6,356,076 B1 * 3/2002 Luetzow .............. G01D 5/2451 341/15
(Continued)

FOREIGN PATENT DOCUMENTS

CN 112146555 A 12/2020
DE 10309027 A1 * 9/2004 ......... G01D 5/24438
(Continued)

OTHER PUBLICATIONS

International Search Report issued in International Application No. PCT/EP2022/086806, dated Mar. 14, 2023.
(Continued)

*Primary Examiner* — David M Schindler
(74) *Attorney, Agent, or Firm* — Knobbe, Martens, Olson & Bear, LLP

(57) ABSTRACT

Example magnetic sensor system includes a magnet mounted on a rotatable shaft, and a magnetic sensing device in a vicinity of the magnet. The magnetic sensing device includes an angle sensor configured to detect an orientation of a magnetic field generated by the magnet as the rotatable shaft is rotated, a magnetic multi-turn sensor configured to detect a number of turns of the magnetic field generated by the magnet as the rotatable shaft is rotated, a magnetic disk mounted on the rotatable shaft, wherein the disk comprises at least a first track for inducing a change in a magnetic field generated by the magnetic disk, wherein the first track is formed from a plurality of curved segments distributed around the circumference of the magnetic disk, and a first incremental sensor configured to detect changes in the magnetic field induced by the first track as the rotatable shaft is rotated.

20 Claims, 13 Drawing Sheets

(51) Int. Cl.

| | |
|---|---|
| ***G01D 5/245*** | (2006.01) |
| ***G01R 33/07*** | (2006.01) |
| ***G01R 33/09*** | (2006.01) |

(52) U.S. Cl.
CPC ......... *G01R 33/093* (2013.01); *G01R 33/096* (2013.01); *G01R 33/098* (2013.01)

(58) Field of Classification Search
CPC ............. G01R 33/098; G01D 5/24485; G01D 5/2451; G01D 5/145; G01D 5/2452; G01D 5/2454; G01D 5/2455; G01D 2205/26
See application file for complete search history.

(56) References Cited

U.S. PATENT DOCUMENTS

| | | | | |
|---|---|---|---|---|
| 10,393,197 | B2 | 8/2019 | Baehr et al. | |
| 10,415,998 | B2 | 9/2019 | Dietrich et al. | |
| 10,731,737 | B2 | 8/2020 | Dietrich et al. | |
| 10,739,163 | B2 | 8/2020 | Heyd et al. | |
| 11,060,571 | B2 | 7/2021 | Dietrich | |
| 11,398,765 | B2 | 7/2022 | Buchet et al. | |
| 11,536,297 | B2 | 12/2022 | Hodrus | |
| 11,940,303 | B2 * | 3/2024 | Narita | G01B 7/30 |
| 12,111,220 | B2 | 10/2024 | Hintze et al. | |
| 2011/0069390 | A1 * | 3/2011 | Yoshida | G01D 5/38 427/164 |
| 2014/0015384 | A1 | 1/2014 | Someya et al. | |
| 2017/0115134 | A1 | 4/2017 | Wolf et al. | |
| 2019/0242764 | A1 * | 8/2019 | Nicholl | B62D 15/0215 |
| 2019/0285439 | A1 | 9/2019 | Santos et al. | |
| 2020/0182314 | A1 | 6/2020 | Wei et al. | |
| 2022/0099463 | A1 * | 3/2022 | Schmidt | G01D 5/165 |
| 2022/0115932 | A1 | 4/2022 | Schmitt et al. | |
| 2022/0355863 | A1 | 11/2022 | Lindenmayr et al. | |
| 2022/0412774 | A1 * | 12/2022 | Santos | G01D 5/24485 |
| 2024/0317300 | A1 | 9/2024 | Pathan | |

FOREIGN PATENT DOCUMENTS

| | | | | |
|---|---|---|---|---|
| DE | 102005042616 | A1 * | 3/2007 | G01D 5/145 |
| DE | 102016212925 | A1 | 1/2018 | |
| DE | 102018118258 | A1 | 1/2020 | |
| DE | 102018130778 | A1 | 1/2020 | |
| DE | 102018120419 | A1 | 2/2020 | |
| DE | 102020114871 | A1 | 9/2021 | |
| DE | 102020115906 | A1 | 9/2021 | |
| DE | 102020108981 | A1 | 10/2021 | |
| DE | 102020108982 | A1 | 10/2021 | |
| DE | 102018222879 | A1 | 9/2022 | |
| DE | 102021111644 | A1 | 11/2022 | |
| DE | 102022102110 | A1 | 8/2023 | |
| DE | 102022132777 | A1 | 6/2024 | |
| EP | 3523608 | A1 | 8/2019 | |
| EP | 3645980 | B1 | 5/2020 | |
| JP | U3-106416 | | 10/2004 | |
| JP | 2005-172721 | | 6/2005 | |
| JP | 2008-508510 | | 3/2008 | |
| JP | 4224033 | B2 | 2/2009 | |
| JP | 4-331317 | | 9/2009 | |
| JP | 55-67608 | | 8/2014 | |
| JP | 2018-54573 | | 4/2018 | |
| JP | 2019-191155 | | 10/2019 | |
| KR | 20180114743 | A | 10/2018 | |
| WO | WO 2018/028739 | A1 | 2/2018 | |
| WO | WO 2018/149446 | A1 | 8/2018 | |
| WO | WO 2018/224081 | A1 | 12/2018 | |
| WO | WO 2023/147801 | A1 | 8/2023 | |

OTHER PUBLICATIONS

Written Opinion issued in International Application No. PCT/EP2022/086806, dated Mar. 14, 2023.

Japanese office action received in application No. 2024-537547 dated Jun. 24, 2025.

* cited by examiner

MAGNETIC SENSOR SYSTEM

CROSS REFERENCE TO RELATED APPLICATIONS

This application claims the benefit of and priority from U.S. Provisional Patent Application No. 63/265,722, filed Dec. 20, 2021, titled "MAGNETIC SENSOR SYSTEM," the disclosure of which is hereby incorporated by reference herein in its entirety.

FIELD OF THE DISCLOSURE

The present disclosure relates magnetic sensor systems. In particular, the present disclosure relates to a magnetic sensor system comprising an angle sensor and multi-turn sensor, and a magnetic incremental sensor arranged to monitor a magnetic track.

BACKGROUND

Magnetic single turn sensors and multi-turn sensors are commonly used in applications where there is a need to monitor both the number of times a device has been turned and its precise angular position. An example is a steering wheel in a vehicle.

Magnetic multi-turn sensors and single turn sensors typically use magnetoresistive elements that are sensitive to an applied external magnetic field. The resistance of the magnetoresistive elements in multi-turn sensors can be changed by rotating a magnetic field within the vicinity of the sensor. Variations in the resistance of the magnetoresistive elements can be tracked to determine the number of turns in the magnetic field, which can be translated to a number of turns in the device being monitored. Similarly, variations in the resistance of the magnetoresistive elements in single turn sensors can be tracked to determine the magnetic field angle, which can be translated to the angular position of the device being monitored.

BRIEF DESCRIPTION OF THE DRAWINGS

In the drawings, like reference numerals refer to like parts or components. The drawings illustrate generally, by way of example, but not by way of limitation, various embodiments discussed in the present document.

DETAILED DESCRIPTION

Figure 1:
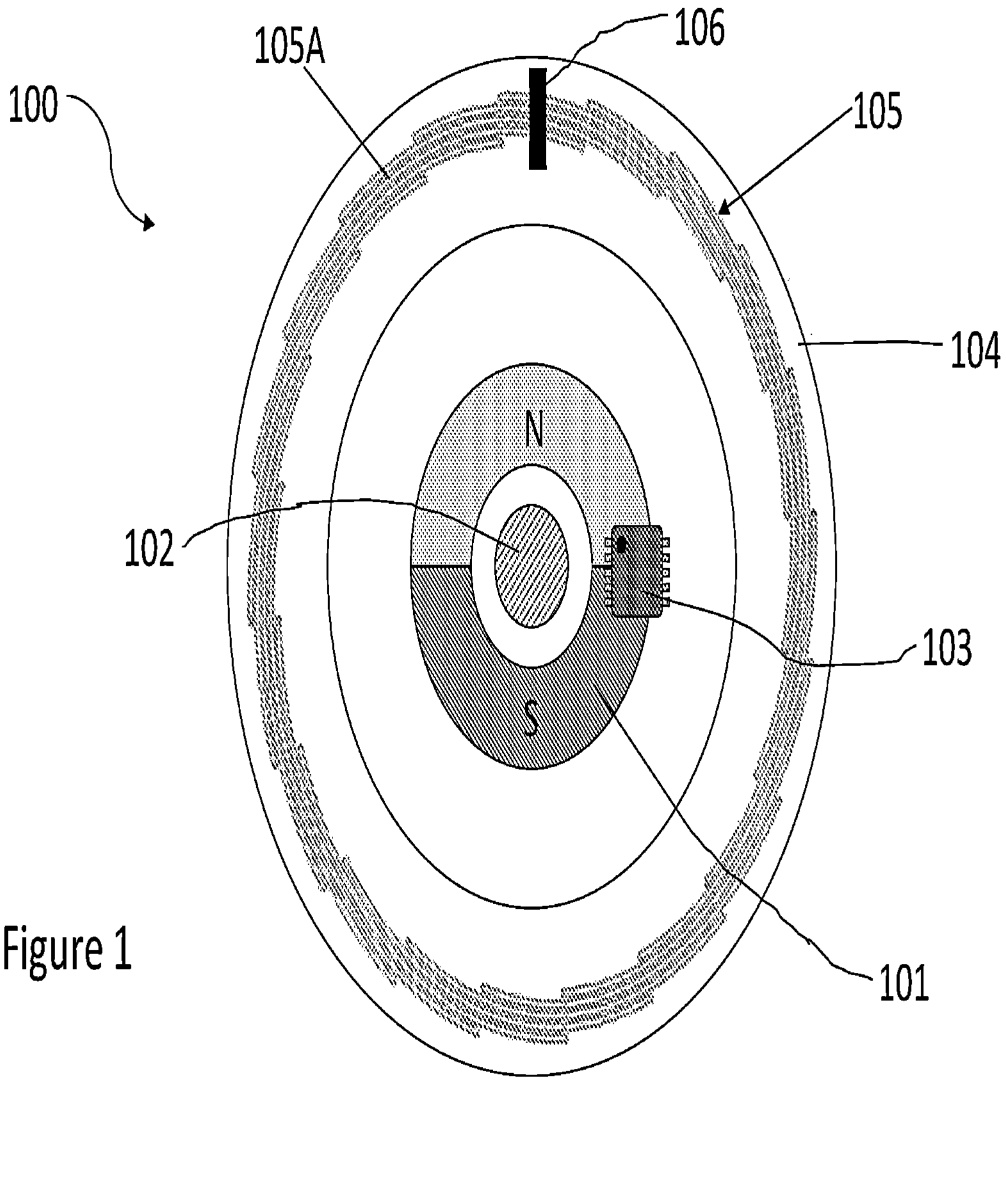
FIG. 1 is a first example of a magnetic sensor system in accordance with embodiments of the disclosure.

The present disclosure provides a magnetic sensing system that implements a magnetic multi-turn sensor and absolute angle sensor in conjunction with a rotating magnet for counting turns and providing rough angle position information, along with an incremental sensor system using a rotating disk that has a track formed from Archimedean spiral shaped structures to thereby provide a higher precision angle measurement. In this respect, a magnetic sensing device comprising the multi-turn sensor and angle sensor is arranged in proximity to a magnet mounted to the end of a rotating shaft. The magnetic sensing device detects the rotating magnetic field to measure the number of turns and the absolute angle of the rotating shaft to a first level of resolution and precision. The rotating disk is also coupled to the rotating shaft and is formed from a magnetic material. The track is then formed in the magnetic disk such that a magnetic incremental sensor detects a periodically changing magnetic field as the disk rotates with the shaft. Starting from the angle measurement provide by the magnetic sensing device, the signal output by the incremental sensor can then be used to provide a higher resolution measurement of the angular position.

A first aspect of the present disclosure provides a magnetic sensor system, comprising a magnet mounted on a rotatable shaft, and a magnetic sensing device in a vicinity of the magnet, the magnetic sensing device comprising an angle sensor configured to detect an orientation of a magnetic field generated by the magnet as the rotatable shaft is rotated, a magnetic multi-turn sensor configured to detect a number of turns of the magnetic field generated by the magnet as the rotatable shaft is rotated, a magnetic disk mounted on the rotatable shaft, wherein the disk comprises at least a first track for inducing a change in a magnetic field generated by the magnetic disk, wherein the first track is formed from a plurality of curved segments distributed around the circumference of the magnetic disk, and a first incremental sensor configured to detect changes in the magnetic field induced by the first track as the rotatable shaft is rotated.

The plurality of curved segments may comprise a plurality of Archimedean spiral segments distributed around the circumference of the magnetic disk.

The system may further comprise a processing circuit in communication with the magnetic sensing device and the first incremental sensor, the processing circuit being configured to determine a first angle measurement based on an output signal from the angle sensor, and determine a second angle measurement based on the first angle measurement and an output signal from the first incremental sensor, wherein the second angle measurement has a higher resolution than the first angle measurement.

In some arrangements, the output signal from the angle sensor may comprise a sine component and a cosine component. Similarly, the output signal from the first incremental sensor may comprise a sine component and a cosine component.

The output signal from the first incremental sensor may have a greater periodicity per revolution than the output signal from the angle sensor.

The periodicity of the output signal from the first incremental sensor per revolution may be dependent on the configuration of the first track. For example, the periodicity may be dependent on at least one of: the number of curved segments, the gradient of the curved segments and a distance between the curved segments.

In some arrangements, the plurality of curved segments may be formed as one of: protrusions, holes, blind holes or indentations.

The system may further comprise at least a second incremental sensor configured to detect changes in the magnetic field induced by the first track as the rotatable shaft is rotated. In some arrangements, the first incremental sensor and the second incremental sensor may be arranged on opposing sides of the first track.

In such cases, the processing circuit may be in further communication with the second incremental sensor and further configured to determine the second angle measurement based on an average of the output signals from the first and second incremental sensors.

The system may comprise a plurality of incremental sensors configured to detect changes in the magnetic field induced by the first track as the rotatable shaft is rotated, the plurality of incremental sensors being positioned equidistantly around the first track.

The magnetic disk may further comprise a second track comprising a set of features for inducing a change in a magnetic field generated by the magnetic disk. In such arrangements, the set of features may be one of: protrusions, holes, blind holes or indentations. The second incremental track is preferably provided at a different radial position than the first incremental track relative to the central axis of the magnetic disk. For example, the second incremental track may be positioned further from the central axis than the first incremental track, or vice versa. The system may further comprise at least a third incremental sensor configured to detect changes in the magnetic field induced by the second track as the rotatable shaft is rotated.

The magnetic disk may comprise a ferromagnetic material.

The angle sensor may be one of: an anisotropic magnetoresistive (AMR) based single turn sensor, a giant magnetoresistive (GMR) based single turn sensor, a tunnel magnetoresistive (TMR) based single turn sensor, a Hall effect sensor and an inductive sensor.

The magnetic multi-turn sensor is a giant magnetoresistive (GMR) based multi-turn sensor, or a tunnel magnetoresistive (TMR) based multi-turn sensor.

A further aspect of the present disclosure provides a method of monitoring a position of a rotatable shaft, wherein a magnet and a magnetic disk are mounted on the rotatable shaft, the method comprising detecting, using an angle sensor, an orientation of a magnetic field generated by the magnet as the rotatable shaft is rotated, detecting, using a first incremental sensor, changes in the magnetic field generated by the magnetic disk as the rotatable shaft is rotated, wherein the changes are induced by a first track formed on the magnetic disk, the first track comprising a plurality of curved segments distributed around the circumference of the magnetic disk, determining a first angle measurement based on an output signal from the angle sensor, and determining a second angle measurement based on the first angle measurement and an output signal from the first incremental sensor, wherein the second angle measurement has a higher resolution than the first angle measurement.

The plurality of curved segments may comprise a plurality of Archimedean spiral segments distributed around the circumference of the magnetic disk.

The method may further comprise detecting, using a magnetic multi-turn sensor, a number of turns of the magnetic field generated by the magnet as the rotatable shaft is rotated.

A further aspect of the present disclosure provides a magnetic sensor system, comprising a first magnet mounted on a rotatable shaft, a magnetic sensing device in a vicinity of the first magnet, the magnetic sensing device comprising, an angle sensor configured to detect an orientation of a magnetic field generated by the first magnet as the rotatable shaft is rotated, and a magnetic multi-turn sensor configured to detect a number of turns of the magnetic field generated by the first magnet as the rotatable shaft is rotated, at least one bias magnet configured to produce a further magnetic field, and at least a first further magnetic sensor configured to detect changes in the further magnetic field induced by a first magnetic target arranged to be rotated the rotatable shaft, the first magnetic target having a first number of features for inducing a change in the further magnetic field.

The system may further comprise a second further magnetic sensor configured to detect changes to the further magnetic field induced by a second magnetic target arranged to be rotated by the rotatable shaft, the second magnetic target having a second number of features for inducing a change in the magnetic field.

The system may further comprise a processing circuit in communication with the first further magnetic sensor and the second further magnetic sensor, the processing circuit configured to detect a difference between measurements obtained by the first further magnetic sensor and the second further magnetic sensor, and generate shaft rotation angle information associated with a rotation angle of the rotatable shaft based on the detected differences between measurements obtained from the first further magnetic sensor and the second further magnetic sensor.

The following detailed description of embodiments presents various descriptions of specific embodiments of the invention. However, the invention can be embodied in a multitude of different ways. In this description, reference is made to the drawings, where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Magnetic multi-turn and single turn sensors can be used to monitor the turn count and angular position of a rotating shaft. Such magnetic sensing can be applied to a variety of different applications, such as automotive applications, medical applications, industrial control applications, consumer applications, and a host of other applications which require information regarding a position of a rotating component.

In industrial and automotive applications, a precise angle measurement system that is capable of measuring multiple rotations of a shaft is sometimes needed. Systems like steering angle measurement, rack and pinion, and/or leadscrew applications often need to have these measurement capabilities. In many applications, the shaft end is not easily accessible, and so it is not possible to place the magnet sensor arrangement at the end of the shaft. Additionally, known angle sensor systems do not provide the resolution and precision information needed for some applications. One solution is to use an optical encoder; however, these can be very expensive. Another solution is to implement obtain multi-turn information from a mechanical gear coupled to the rotating shaft, however, the pitch of the teeth of the gear will depend on the diameter of the gear, and the angle sensor has to be built for the pitch of the teeth. Therefore, not all angle sensors can be used with all gears, which is not practical.

The present disclosure thus provides a magnetic sensing system that implements a magnetic multi-turn sensor and absolute angle sensor in conjunction with a rotating magnet for counting turns and providing rough angle position information, along with an incremental sensor system using a rotating disk that has a track formed from Archimedean spiral shaped structures to thereby provide a higher precision angle measurement.

In this respect, a magnetic sensing device comprising the multi-turn sensor and angle sensor is arranged in proximity to a magnet mounted to the end of a rotating shaft. The magnetic sensing device detects the rotating magnetic field to measure the number of turns and the absolute angle of the rotating shaft to a first level of resolution and precision. The rotating disk is also coupled to the rotating shaft and is formed from a magnetic material. The track is then formed in the magnetic disk such that a magnetic incremental sensor detects a periodically changing magnetic field as the disk rotates with the shaft. Starting from the angle measurement provide by the magnetic sensing device, the signal output by the incremental sensor can then be used to provide a higher resolution measurement of the angular position.

FIG. 1 illustrates a first example of a magnetic sensor system 100 according to the present disclosure. A permanent magnetic ring 101 is mounted to the end of a rotatable shaft 102, which itself will be coupled to some mechanical system that is to be monitored. A magnetic sensing device 103 comprising a magnetic absolute angle sensor (also referred to herein as a single turn sensor) and a magnetic multi-turn sensor is positioned in proximity to the magnet 101. More specifically, the magnetic sensing device 103 is positioned "off shaft" insofar that it is not aligned with the rotational axis of the shaft 103, but instead placed within the plane perpendicular to the rotational axis. Further details of the magnetic angle sensor and multi-turn sensor are described below. The magnetic sensing device 103 measures changes in the rotating magnetic field generated by the magnet 101 as it rotates with the shaft 102, to thereby determine the number of turns and angular position of the shaft 102 to a first level of precision and resolution, for example, in units of degrees.

A disk 104 is also connected to the shaft 103 such that it rotates with the shaft 103. The disk 104 comprises a soft ferromagnetic material and is provided with a track 105 comprising a plurality of curved segments 105A that are distributed around the circumference of the disk 104 in a staggered arrangement. The segments 105A are formed like small overlapping sections of an Archimedean spiral placed adjacent to each other, with each segment 105A being offset from the adjacent segment(s) 105A. That is to say, the segments 105A are curved such that the radius of each segment 105A decreases as it extends around the disk 104 in a particular direction, with each segment 105A starting and finishing at a different point around the circumference of the disk 104.

In this example, the radius decreases as the segments 105A extend in a clockwise direction, but it will of course be appreciated that the segments 105A may be configured to decrease in radius as they extend around the disk 104 in an anti-clockwise (counterclockwise) direction.

With continuing reference to FIG. 1, a magnetic incremental sensor 106 is placed in relation to the track 105 such that it measures the magnetic field or changes in the magnetic field caused by the track 105. In this respect, the segments 105A of the track 105 may be formed as indents, raised protrusions, holes or any other feature capable of producing a varying magnetic field as the disk 104 rotates. The signal output by the incremental sensor 106 can then be used to further increase the resolution and precision of the measured angular position, for example, in units of arc minutes.

Figure 2A:
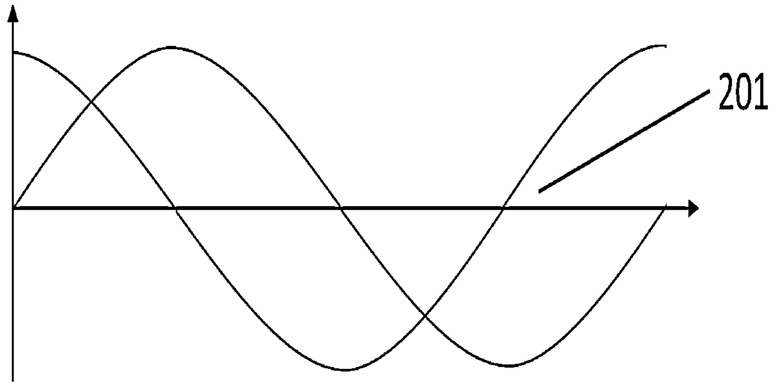
FIGS. 2A-B are graphs illustrating an example output of the magnetic sensor system of FIG. 1.

FIG. 2A illustrates an example of the output signals 201 of the magnetic single turn sensor, wherein the output signal 201 comprises a sine and cosine signal repeating once or twice per revolution. For example, an absolute angle sensor with a resolution of 180° will repeat the sine and cosine signals twice per revolution, whilst an absolute angle sensor with a resolution of 360° will repeat the sine and cosine signals once per revolution. The arctan of the sine and cosine signals can then be calculated to output the magnetic field angle and thus the angular position of the rotating shaft.

In cases where the sine and cosine signals repeat every two revolutions, the turn count of the multi-turn sensor (or some other quadrant detection means) can be used to resolve which half turn of the full revolution is being measured by the angle sensor, for example, whether the angle sensor is measuring 0° to 180° of rotation or 180° to 360° of rotation.

Figure 2B:
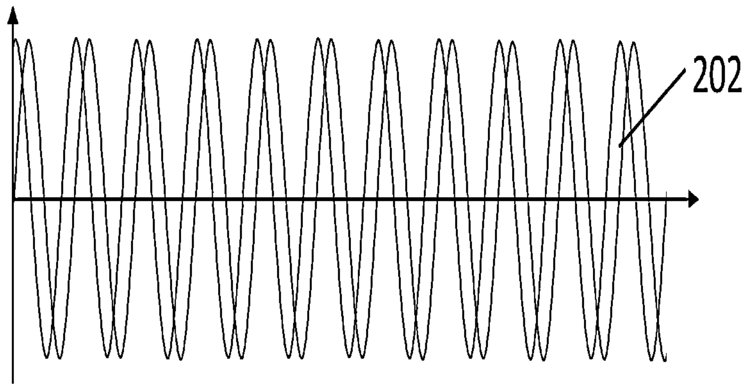

FIG. 2B illustrates an example of the output signals 202 of the incremental sensor 106. The output signal 202 also comprises a sine and cosine signal, however, these signals have multiple periods per revolution (significantly more than 2). As with the single turn sensor, the arc tan of the sine and cosine signal is calculated to provide an angle measurement. However, each repetition of the sine and cosine will correspond to a smaller portion of each revolution. For example, for a periodicity of 12, each sine and cosine signal will correspond to 30° of rotation, and hence the arctan of each sine and cosine signal will provide a higher resolution measurement within each 30° rotation.

One benefit of using a track 105 with Archimedean spiral segments 105A is that the number of periods per revolution can be adjusted independent of the diameter of the disc 104 and the track 105. In this case, the number of segments 105A is equal to the number of periods of the output signal 202 per revolution. However, the distance between the segments 105A or the incline of the segments 105A can be adjusted to provide any suitable periodicity, and thus resolution. Ideally, the precision of the absolute angle sensor within the magnetic sensing device 103 is good enough to conclude on which period of the incremental sensor 106 is positioned, and so the number of segments 105A and/or periods of the incremental track 105 need to be limited to fulfil this requirement. With the Archimedean spiral segments 105A, this can be achieved for almost every disk diameter and any pitch required.

The track 105 may be formed using any suitable fabrication method. For example, the track 105 may be formed using a suitable stamping or imprint tool. Similarly, the track 105 may be formed by etching into the soft ferromagnetic material of the disk 104, or by applying a hard photoresist mask and etching around the mask to leave a plurality of raised segments 105A.

Figure 10A:
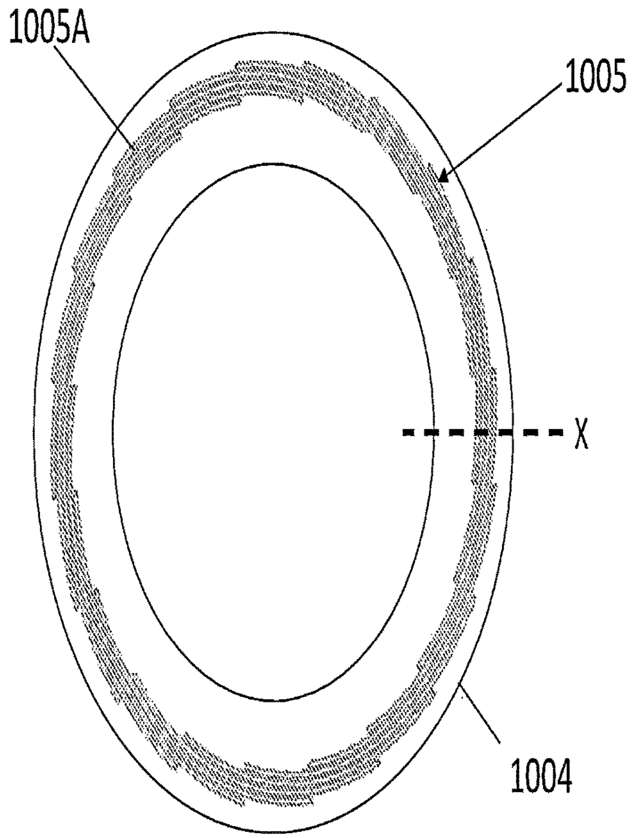
FIGS. 10A-B illustrate the structure of part of the magnetic sensor system in accordance with embodiments of the disclosure.
Figure 10B:
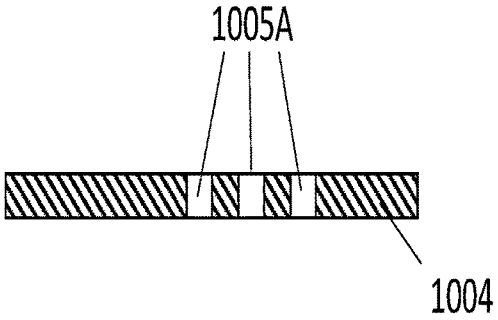

FIGS. 10A-B illustrate an example of the configuration of the magnetic disk 1004 and the track 1005 that may be used in conjunction with any of the examples described herein, where FIG. 10B shows a cross-section of the magnetic disk 1004 taken across the line denoted "X" in FIG. 10A. In this example, the Archimedean spiral segments 1005A of the track 1005 are formed as holes 1005A formed in the disk 1004.

Figure 11A:
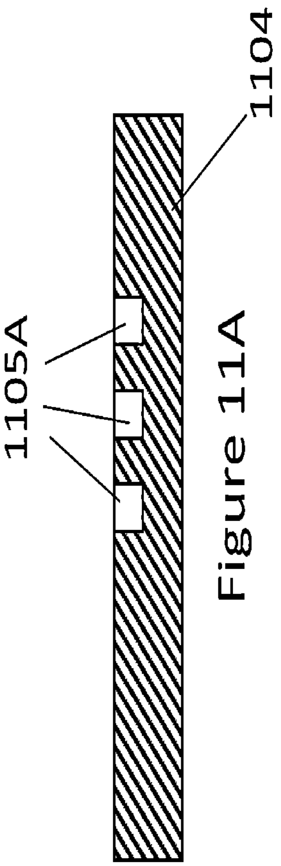
FIGS. 11A-C further illustrate the structure of part of the magnetic sensor system in accordance with embodiments of the disclosure.
Figure 11B:
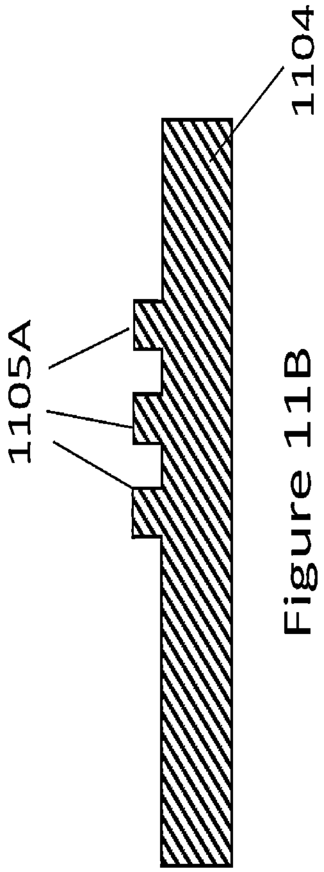
Figure 11C:
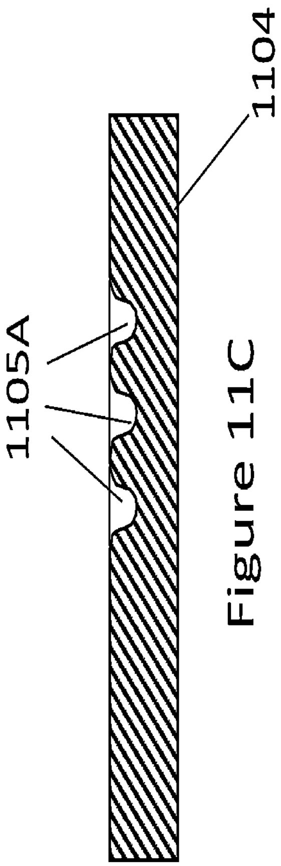

FIGS. 11A-C illustrate further examples of how the track may be formed in the magnetic disk 1104. As shown in FIG. 11A, the Archimedean spiral segments 1105A are formed as indents in the magnetic disk 1104 that only extend partially into the magnetic disk 1104. In FIG. 11B, the Archimedean spiral segments 1105A are formed as raised protrusions 1105A but etching the surface of the magnetic disk 1104. In FIG. 110, the Archimedean spiral segments 1105A are again formed as indents in the magnetic disk 1104, however, in this example the segments 1105A have a curved or corrugated profile, rather than the square profile shown in FIG. 11A.

Figure 3:
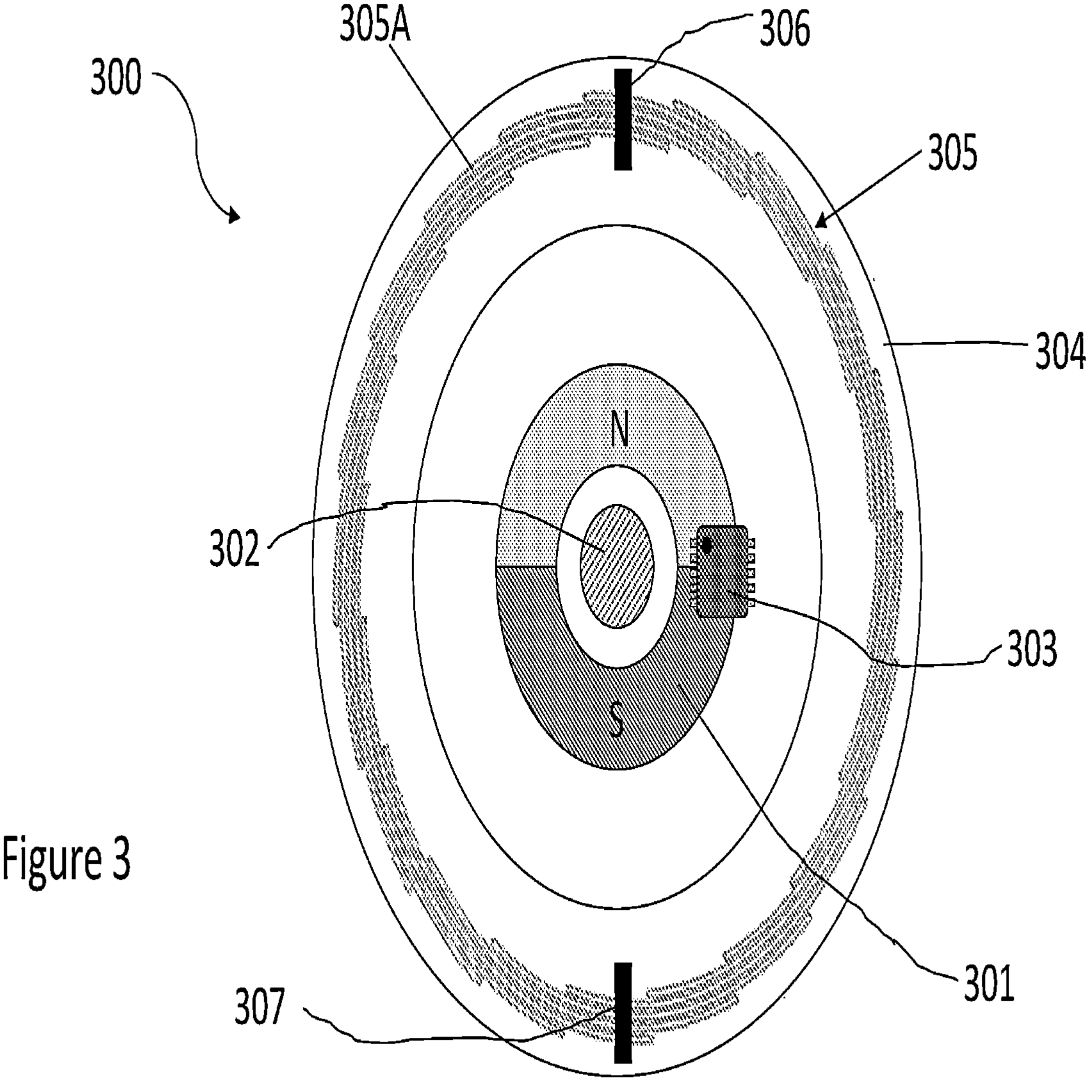
FIG. 3 is a second example of a magnetic sensor system in accordance with embodiments of the disclosure.

FIG. 3 shows a second example of a magnetic sensing system 300 that may be used to measure the rotation of a magnet 301 mounted to the end of rotatable shaft 302. The magnetic sensing system 300 is substantially the same as the magnetic sensor system shown in FIG. 1, but in this example, a second magnetic incremental sensor 307 is positioned on the opposite side of the rotating magnetic disk 304, which again comprises a track 105 comprising a plurality of curved segments 105A that are distributed around the circumference of the disk 104. The combination of both incremental sensors 306, 307 allows a first order compensation of any mechanical eccentricity experience by the magnetic disk 304, by mathematically averaging the position measured by each sensor 306, 307. Indeed, it will be appreciated that any number of incremental sensors separated by an equal angular distance can be used to further compensate for eccentricity. For example, four incremental sensors positioned at 0°, 90°, 180° and 270° may be used, or three incremental sensors positioned at 0°, 120° and 240°.

Figure 4:
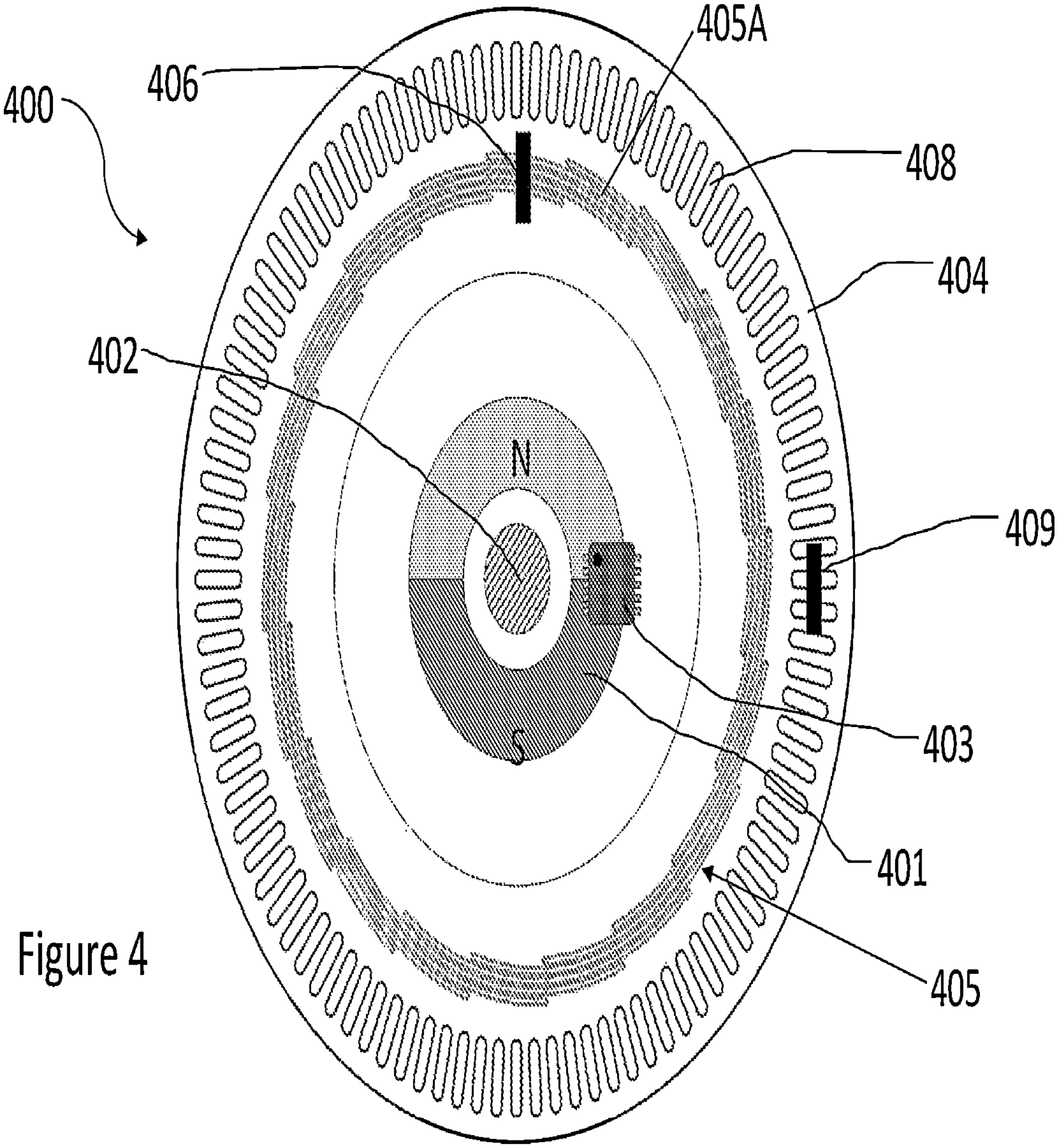
FIG. 4 is a third example of a magnetic sensor system in accordance with embodiments of the disclosure.

FIG. 4 shows a third example of a magnetic sensing system 400 that may be used to measure the rotation of a magnet 401 mounted to the end of rotatable shaft 402. The magnetic sensing system 400 is substantially the same as that shown in FIG. 1. In this example, the magnetic disk 404 again comprises a first track 405 comprising a plurality of curved segments 505A that are distributed around the circumference of the disk 404 at a first radial position, along with a second incremental track 408 disposed on the magnetic disk 404 at a second radial position and a second incremental sensor 409 arranged in relation to the second track 408. In this example, the first incremental track 405 is positioned at a smaller radial distance from the central axis of the disk 404, whilst the second incremental track 408 is positioned at a larger radial distance from the central axis of the disk 404, although it will be appreciated that the first incremental track 405 may be positioned further from the central axis than the second incremental track 408. The second incremental track 408 can be made of Archimedean spiral segments, or other alternating structures like equality spaced holes, indentations, involute gear shapes or similar. In this example, the second track 408 comprises a plurality of slots and provides a sensor signal with a significantly higher number of periods, and thus a higher level of resolution and precision. With this arrangement, the output of the first incremental sensor 406 and the first incremental track 405 can be used to determine the position of the second incremental sensor 409 on the second incremental track 408, with the second incremental track 408 then providing a higher resolution and a higher precision measurement of the angular position of the shaft 402, for example, in units of arc seconds.

Figure 5:
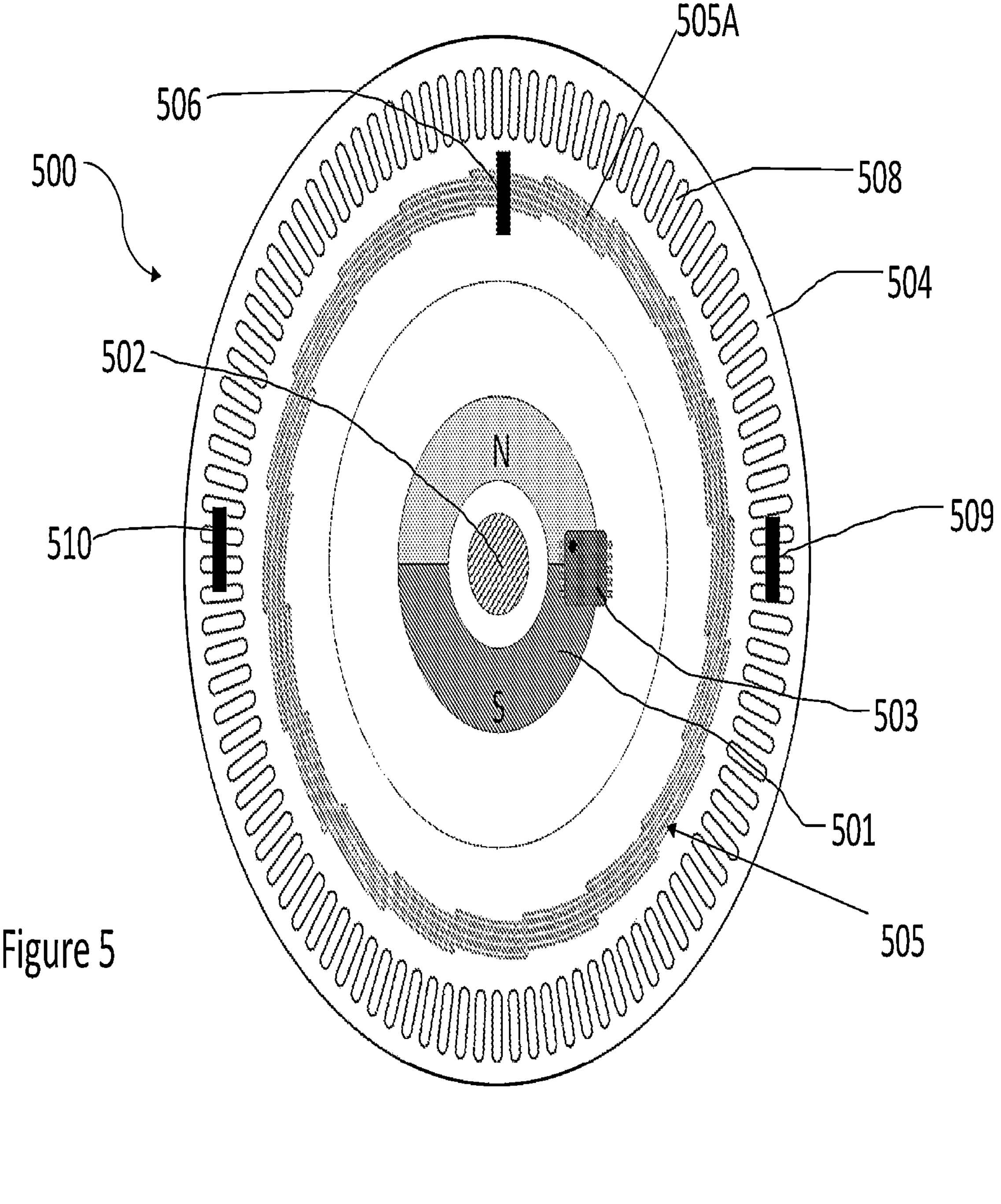
FIG. 5 is a fourth example of a magnetic sensor system in accordance with embodiments of the disclosure.

As described with reference to FIG. 3, the runout in the system caused by mechanical eccentricity can be reduced to by using multiple sensors on a magnetic track, preferably, the track having the highest resolution. For example, as shown in FIG. 5, which corresponds substantially to the system described with reference to FIG. 4, two incremental sensors 509 and 510 may be arranged on opposite sides of the highest resolution track, which in this case is the second magnetic track 508. As described before, any number of incremental sensors spaced equidistantly apart may be used, with the average measurement being calculated therefrom to compensate for any radial movement by the track 508.

Figure 6:
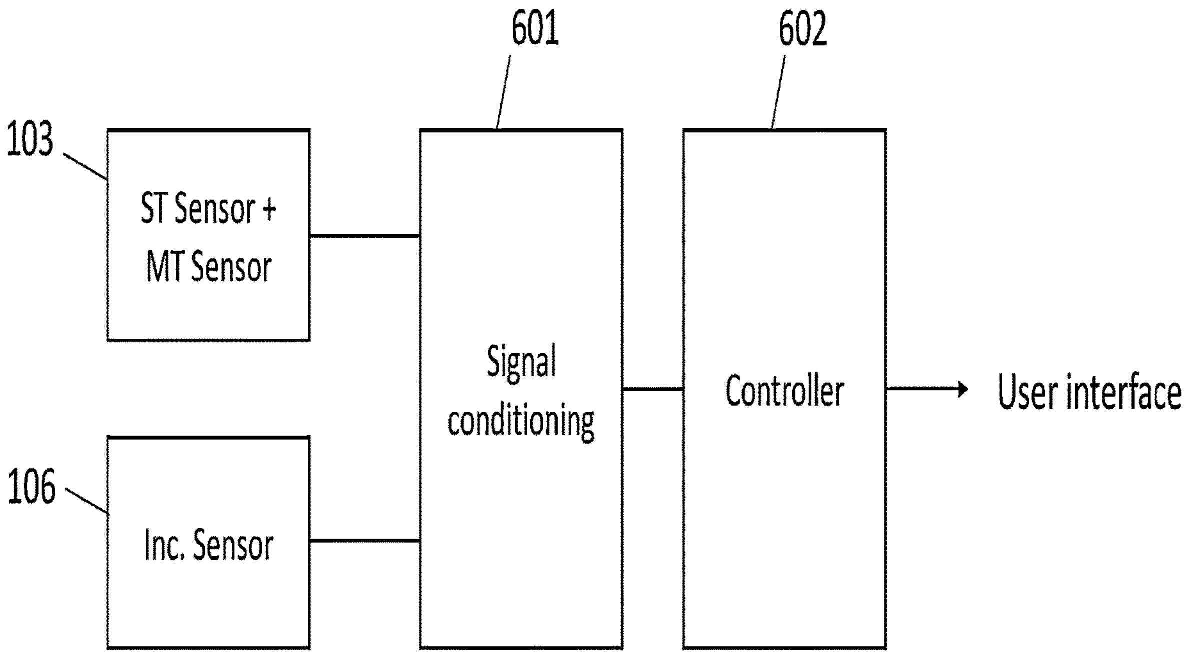
FIG. 6 is a block diagram illustrating the signal path between components of the magnetic sensor system.

FIG. 6 illustrates an example of the signal paths between components of the magnetic sensor systems described herein. The signals of the magnetic sensing device 103 (i.e., the single turn sensor the multi-turn sensor) and the incremental sensor 106 are first signal conditioned 601 (for example, amplified, analog digital converted, filtered, offset corrected, amplitude corrected, phase corrected and the like). It will be appreciated that the signal conditioning 601 may be performed by a plurality of signal processing components. A controller 602 then processes the data to calculate an angular position including multiple turns, which may then be output to a user interface. The angular position may also be fed into other control means depending on the specific application. For example, the angular position may be fed into a control system for motor commutation. Indeed, it will be appreciated that the angular position may be fed into any system that uses high precision positioning, such as precision machining, microscope tables, optical steppers, robotic arms and the like.

Figure 7:
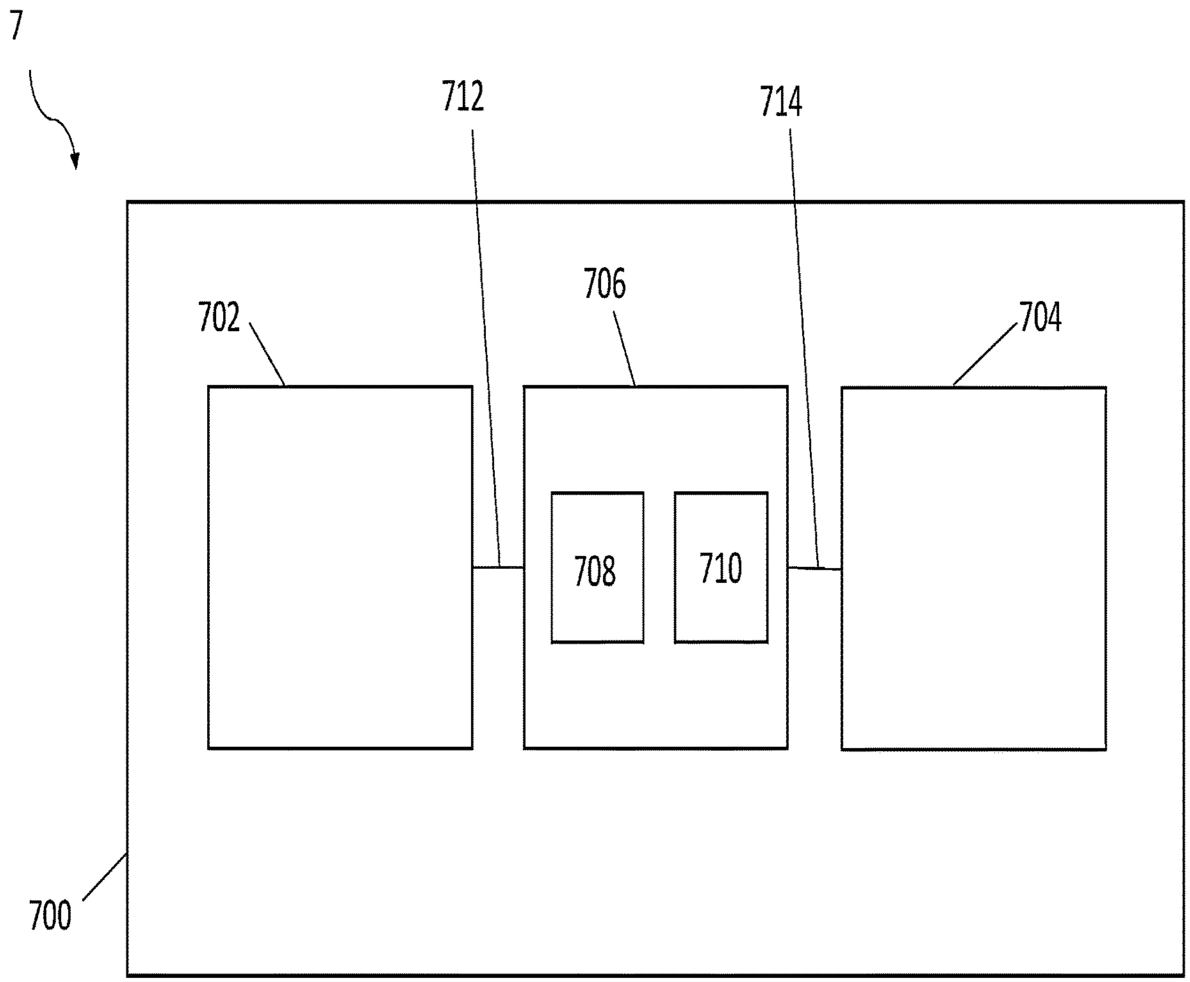
FIG. 7 is an example of a magnetic sensing device in accordance with embodiments of the disclosure.

FIG. 7 illustrates a schematic block diagram of an example magnetic sensing device 7 used in examples of the disclosure that includes a multi-turn (MT) sensor 702 and a single turn (ST) sensor 704. It will be appreciated that the magnetic sensing device 7 shown in FIG. 7 may be any of the magnetic sensing devices 103, 303, 403, 503 used in the examples shown in FIGS. 1 and 3 to 6. The MT sensor 702 is preferably a giant magnetoresistive (GMR) or tunnel magnetoresistive (TMR) based MT sensor. The ST sensor 704 may be any magnetic ST sensor, for example, a anisotropic magnetoresistive (AMR), giant magnetoresistive (GMR) or tunnel magnetoresistive (TMR) based sensor, a Hall sensor or an inductive sensor.

The sensing device 7 also comprises a processing circuit 706, and an integrated circuit 700 on which the MT sensor 702, the ST sensor 704 and processing circuit 106 are disposed. The processing circuit 106 receives signals SMT 712 from the MT sensor 702 and processes the received signals to determine that the turn count using a turn count decoder 708, which will output a turn count representative of the number of turns of an external magnetic field rotating in the vicinity of the MT sensor 702, for example, the magnetic field generated by the ring magnet 103, 303, 403, 503 mounted on the rotating shaft 102, 302, 402, 502. Similarly, the processing circuit 706 may also receive signals SST 714 from the ST sensor 704 and process the received signals using an angle decoder 710 to output an angular position of the external magnetic field.

Figure 8:
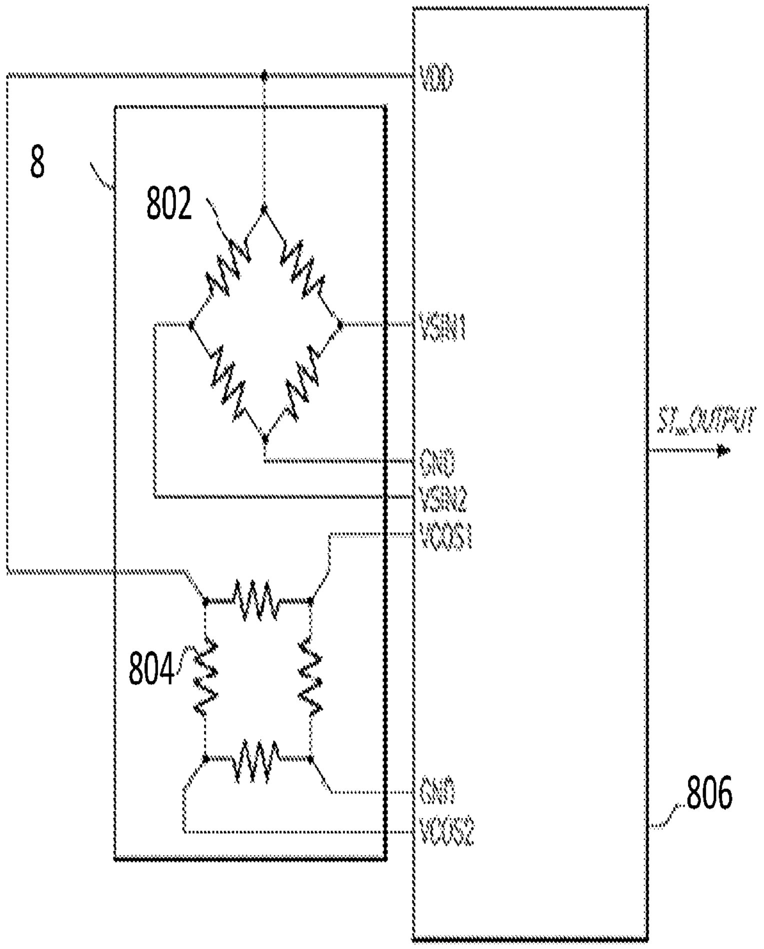
FIG. 8 is an example of an angle sensor in accordance with embodiments of the disclosure.

FIG. 8 is a schematic diagram showing an example of a ST angle sensor 8, which may provide the ST sensor 704 of FIG. 7, with an interface circuit 806 according to an embodiment of the present disclosure. The interface circuit 806 can be part of the processing circuit 706. Alternatively, the interface circuit 806 can be a separate circuit between the processing circuit 706 and the output of the angle sensor 8. As shown in FIG. 8, the angle sensor 8 includes a first Wheatstone bridge 802 and a second Wheatstone bridge 804.

The first and second Wheatstone bridges 802 and 804, respectively, can include magneto-resistive elements, such as AMR elements, to sense a rotating magnetic field and to provide rotational angle information between 0 and 360 degrees, which also corresponds to an angle of between 0 and 2π radians. Additionally, each AMR element can be patterned onto an integrated circuit using an AMR process so that the first Wheatstone bridge 802 is rotated with respect to the second Wheatstone bridge 804. By having the first and second Wheatstone bridges 802 and 804 rotated with respect to each other, the trigonometric sine and cosine of a rotational magnetic field can be determined over a range of 0 to 360 degrees, as described above with reference to FIG. 2A.

As shown in FIG. 8, both the first and the second Wheatstone bridges 802 and 804, respectively, are electrically connected to a supply voltage VDD and to ground GND. As illustrated, the interface circuit 206 receives voltages VSIN1 and VSIN2 from the sense nodes of the first Wheatstone bridge 802 and receives voltages VCOS1 and VCOS2 from the sense nodes of the second Wheatstone bridge 804. The voltages VSIN1, VSIN2, VCOS1, and VCOS2 of FIG. 8 can represent components of the signals 714 of FIG. 7. The interface circuit 806 can process the voltages VSIN1 and VSIN2 and the voltages VCOS1 and VCOS2 to determine sine and cosine signals, respectively, associated with a magnetic field. From the sine and cosine signals, the interface circuit 806 can determine the angle of the magnetic field between 0 and 360 degrees. In the example of FIG. 8, the interface circuit 806 provides a single turn angle output data ST_OUTPUT.

Figure 9:
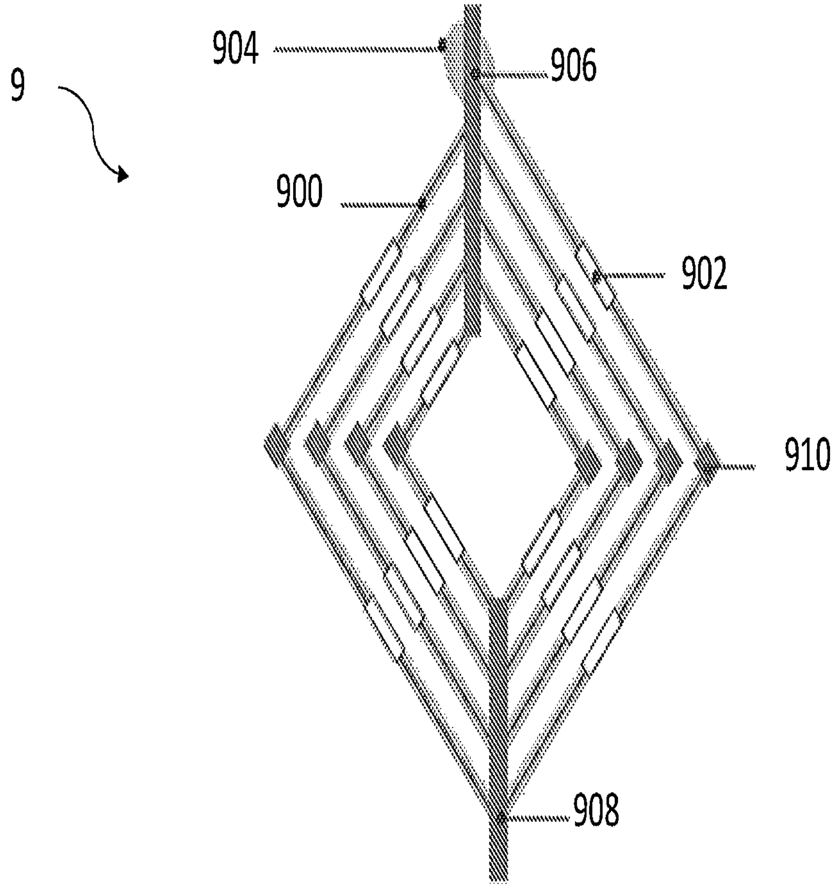
FIG. 9 is an example of a multi-turn sensor in accordance with embodiments of the disclosure.

FIG. 9 shows an example of a magnetic strip 902 layout representation of a magnetic multi-turn sensor 9, which may provide the MT sensor 702 shown in FIG. 7.

In FIG. 9, the magnetic strip 902 comprises a plurality of magnetoresistive elements 904, preferably, GMR based magnetoresistive elements and/or TMR based magnetoresistive elements. In this example, the magnetic strip 902 is a GMR based magnetoresistive track that is physically laid out in a spiral configuration. As such, the magnetic strip 902 has a plurality of segments formed of magnetoresistive elements 904 arranged in series with each other. The magnetoresistive elements 904 act as variable resisters that change resistance in response to a magnetic alignment state. The end of the magnetic strip 902 is coupled to a domain wall generator (DWG) 906, and it will be appreciated that the DWG 906 may be coupled to either end of the magnetic strip 902. The DWG 906 generates domain walls in response to rotations in an external magnetic field, or the application of some other strong external magnetic field the operating magnetic window of the sensor 9. These domain walls are then injected into the magnetic strip 902 and as the magnetic domain changes, the resistance of the magnetoresistive elements 904 will also change due to the resulting change in magnetic alignment.

In order to measure the varying resistance of the magnetoresistive elements 904 as domain walls are generated, the magnetic strip 902 is electrically connected to a supply voltage VDD 908 and to ground GND 910 to apply a voltage between a pair of opposite corners. The corners halfway between the voltage supplies are provided with electrical connections 912 so as to provide half bridge outputs. As such, the multi-turn sensor 9 comprises multiple Wheatstone bridge circuits, with each half bridge 912 corresponding to one half turn or 180° rotation of an external magnetic field. Measurements of voltage at the electrical connections 912 can thus be used to measure changes in the resistance of the magnetoresistive elements 904, which can thus be used to determine the number of turns in the magnetic field, for example, by outputting the voltage measurements to the turn count decoder 708.

The example shown in FIG. 9 comprises 4 spiral windings and 8 half bridges 912 and is thus configured to count four full turns of an external magnetic field. However, it will be appreciated that a multi-turn sensor may have any number of spiral windings depending on the number of magnetoresistive elements 904. In general, multi-turn sensors can count as many turns as spiral windings.

It will also be appreciated that the magnetoresistive elements 904 may be electrically connected in any suitable way so as to provide a sensor output representative of the changes in magnetic alignment state. For example, the magnetoresistive elements 904 may be connected in a matrix arrangement such as that described in US Patent Publication 2017/0261345 (corresponding to U.S. application Ser. No. 15/064,544, filed on Mar. 8, 2016), which is hereby incorporated by reference in its entirety.

In another embodiment, the MT sensor 702 may be a closed-loop spiral, wherein the magnetoresistive elements of the inner and outer spiral winding are connected together to form a continuous spiral. Such an arrangement provides the effect of numerous spirals connected together, which enables a very high number of turns to be counted.

Figure 12:
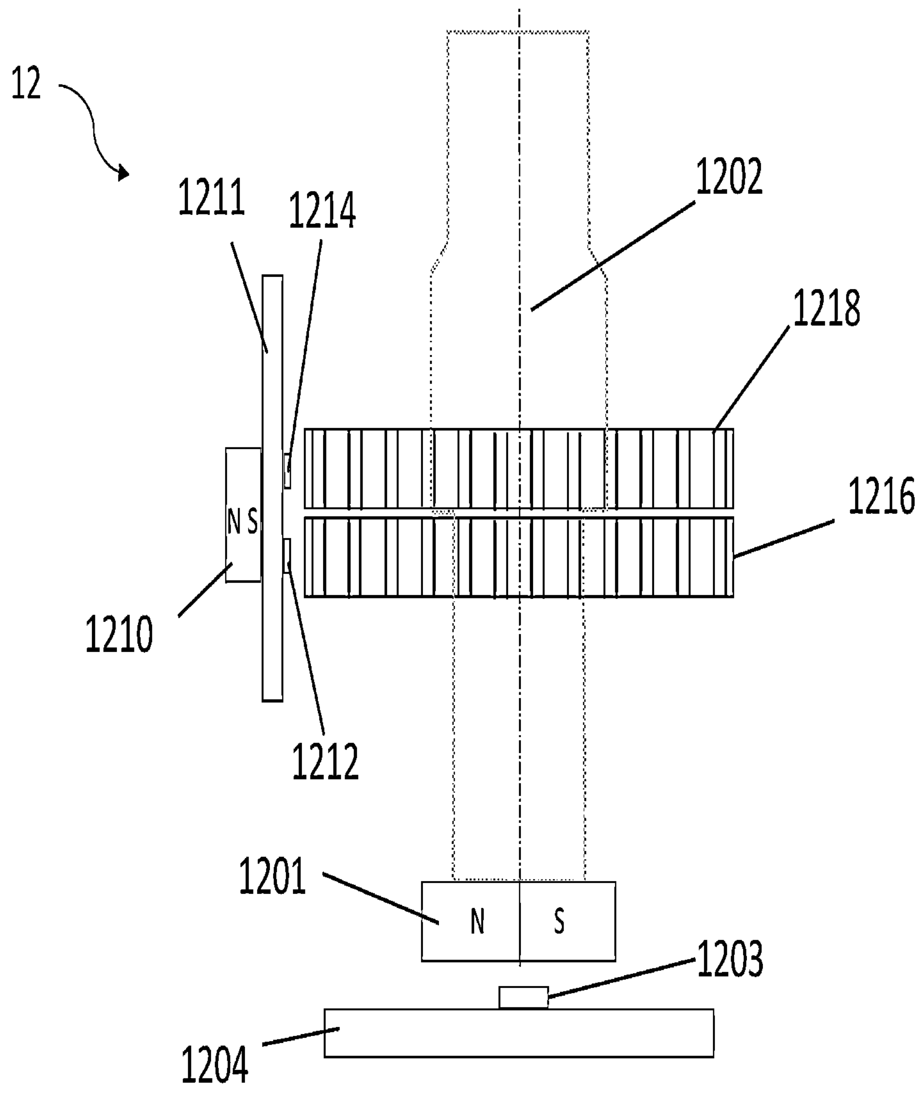
FIG. 12 illustrates a further example of a multi-turn sensor in accordance with embodiments of the disclosure.

FIG. 12 illustrates a further example of a magnetic sensing system 12 that implements a magnetic multi-turn sensor and absolute angle sensor in conjunction with a rotating magnet for counting turns and providing rough angle position information, along with an additional sensor system to thereby provide a higher precision angle measurement. In this example, a permanent magnetic ring 1201 is mounted to the end of a rotatable shaft 1202, which itself will be coupled to some mechanical system that is to be monitored. A magnetic sensing device 1203 comprising a magnetic absolute angle sensor (also referred to herein as a single turn sensor) and a magnetic multi-turn sensor is positioned in proximity to the magnet 1201. More specifically, the magnetic sensing device 1203 is positioned "on shaft" insofar that it is directly aligned with the rotational axis of the shaft 1203. It will of course be appreciated that the magnetic sensing device 1203 may be the same magnetic sensing device as that described with reference to FIGS. 1, and 3 to 9. In this example, the magnetic sensing device 1203 is mounted on the surface of a substrate 1204, for example, a printed circuit board (PCB).

The system 12 further comprises a pair of magnetic sensors 1212 and 1214 mounted on a further substrate 1211 with a back bias magnet 1210 positioned at the back of the sensors 1212 and 1214. The magnetic sensors 5 and 6 may be based on, but are not limited to, Anisotropic Magneto Resistive (AMR) sensor elements, Giant Magneto Resistive (GMR) sensor elements, Tunnel Magneto Resistive sensor elements, any magnetoresistive sensing elements (xMR), or other suitable magnetic sensor technologies.

The magnetic sensors 1212 and 1214 are each positioned close to the surface of two moving targets 1216 and 1218 respectively. In this embodiment, the targets 1216 and 1218 are toothed gears that are affixed to the shaft 1202. In operation, sensors 1212 and 1214 detect the measurable changes in the magnetic field direction passing through the sensors 1212 and 1214, as a result of the magnetic targets 1216 and 1218 rotating and interacting with the magnetic field generated by the magnet 1210. The sensors 1212 and 1214 are configured to measure the absolute rotational position between 0° and 360° of shaft 1202. To do this, the first target gear 1216 is provided with more or fewer teeth than the second target gear 1218. As an example, target gear 1216 may have n teeth, while target gear 1218 may have n−1 or n+1 teeth. In such an example, the Nonius principle applies and the absolute angle of rotation of both gears 1216 and 1218 can be inferred by measuring the relative displacement of teeth on target 1216 with teeth on target 1218 at the position of sensors 1212 and 1214. In particular, when target gears 1216 and 1218 differ in number of teeth by one, the relative offset between adjacent teeth of gears 1216 and 1218 at the position of the magnetic sensors 1212 and 1214 uniquely varies for an entire rotation of the shaft 1202. Thus, by comparing measurements from sensors 1212 and 1214, the absolute angle of rotation of input shaft 1202, between 0° and 360°, can be measured. In this respect, sensors 1212 and 1214 each produce a signal comprising a sine and cosine component as the respective magnetic targets 1216 and 1218 rotate. The "arctan" of each sensor signal (i.e., the sine value divided by the cosine value) is then calculated, and the difference between the arctan values determined for each sensor 1212 and 1214 can then be determined to provide a measurement of the angle of rotation, In use, the magnetic sensors 1212 and 1214 are used to provide the absolute angle of the rotating shaft 1202 to a first level of resolution and precision using the Nonius principle described above. Based on this measured angle of rotation, a higher precision measurement can then be obtained using one of the magnetic sensors 1212 and 1214 and the respective target gear 1216 and 1218. The reason for this is that, when using the Nonius principle, any error that may be exist when measuring from each of the magnetic target gears 1216 and 1218 will start to accumulate when the difference between the arctan values is calculated, which requires further processing to correct the accumulated error. A more precise angle measurement can thus be obtained from the measurement of just one of the magnetic target gears 1216 and 1218. Similarly, as described above, each magnetic sensor 1212 and 1214 will produce a sine and cosine signal for each tooth of the respective target gear 1216 and 1218, which provides a higher resolution measurement of rotation angle compared to the magnetic sensing device 1203. In this respect, it is also important that the teeth of the target gears 1216 and 1218 are uniform in shape and size in order to provide an accurate measurement. The magnetic sensing device 1203 is then used to measure the number of turns. The magnetic sensing device 1203 may also provide an additional measurement of the absolute angle of the rotating shaft 1202, which may be used to validate the angle measurement provided by the magnetic sensors 1212 and 1214.

Figure 13:
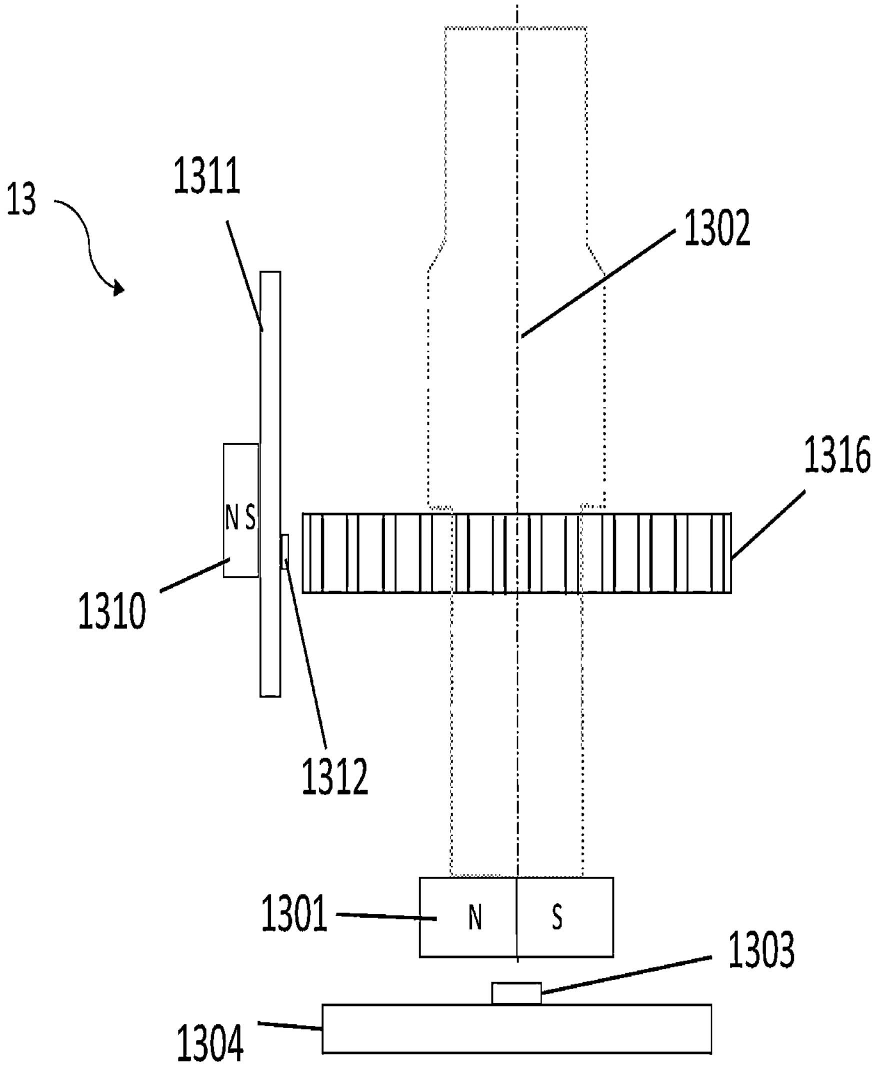
FIG. 13 illustrates yet a further example of a multi-turn sensor in accordance with embodiments of the disclosure.

FIG. 13 provides a further example of a magnetic sensing system 13 that implements a magnetic multi-turn sensor and absolute angle sensor in conjunction with a rotating magnet for counting turns and providing rough angle position information, along with an additional sensor system to thereby provide a higher precision angle measurement. The magnetic sensing system shown in FIG. 13 is similar to that of FIG. 12, however, in this example only one magnetic sensor 1312 and target gear 1314 are provided. As before, a permanent magnetic ring 1301 is mounted to the end of a rotatable shaft 1302, which itself will be coupled to some mechanical system that is to be monitored. A magnetic sensing device 1303 comprising a magnetic absolute angle sensor (also referred to herein as a single turn sensor) and a magnetic multi-turn sensor is positioned in proximity to the magnet 1301, in an "on shaft" position and mounted on the surface of a substrate 1304, for example, a printed circuit board (PCB).

The additional magnetic sensor 1312 is mounted on a further substrate 1311 with a back bias magnet 1310 positioned at the back of the sensor 1312. As before, the magnetic sensor 1312 detects the measurable changes in the magnetic field direction passing through the sensor 1312, as a result of the magnetic target 1316 rotating and interacting with the magnetic field generated by the magnet 1310 to thereby provide 360° angle information.

In use, the magnetic sensing device 1303 is used to measure the number of turns ND provide the absolute angle of the rotating shaft 1302 to a first level of resolution and precision. Based on this measured angle of rotation, a higher precision measurement can then be taken using the magnetic sensor 1312 and the target gear 1316.

In the arrangements shown in FIGS. 12 and 13, it will be appreciated that similar processing circuitry may be used as that shown with respect to FIG. 6, with signals of the magnetic sensors 1212, 1214 and 1312 being input to the processing components of the signal conditioning 601.

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well.

The invention claimed is:

1. A magnetic sensing system, comprising:
- a magnet mounted on a rotatable shaft;
- a magnetic sensing device in a vicinity of the magnet, the magnetic sensing device comprising:
  - an angle sensor configured to detect an orientation of a magnetic field generated by the magnet as the rotatable shaft is rotated, the angle sensor configured to generate a first output signal comprising a first sinusoidal signal;
  - a magnetic multi-turn sensor configured to detect a number of turns of the magnetic field generated by the magnet as the rotatable shaft is rotated;
  - a magnetic disk mounted on the rotatable shaft, wherein the magnetic disk comprises at least a first track and a second track, wherein the first track is formed from a plurality of curved segments distributed around a circumference of the magnetic disk and the second track is formed from a plurality of alternating structures;

a first incremental sensor configured to detect changes in the magnetic field as the rotatable shaft is rotated, the first incremental sensor configured to generate a second output signal comprising a second sinusoidal signal, wherein the first track of the magnetic disk is configured to influence the magnetic field at the first incremental sensor due to relative movement of the first incremental sensor and the first track, the first track introducing periodicity in the magnetic field at the first incremental sensor due to the relative movement of the first incremental sensor and the first track based on the distribution of the plurality of curved segments around the circumference of the magnetic disk, the second sinusoidal signal having a greater number of periods per revolution than the first sinusoidal signal; and a second incremental sensor configured to detect changes in the magnetic field as the rotatable shaft is rotated, the second incremental sensor configured to generate a third output signal comprising a third sinusoidal signal, wherein the second track of the magnetic disk is configured to influence the magnetic field at the second incremental sensor due to relative movement of the second incremental sensor and the second track, the second track introducing periodicity in the magnetic field at the second incremental sensor due to the relative movement of the second incremental sensor and the second track based on the distribution of the plurality of alternating structures around the circumference of the magnetic disk, the third sinusoidal signal having more than twice a number of periods per revolution than the second sinusoidal signal; and a processing circuit in communication with the magnetic sensing device and the first incremental sensor, the processing circuit being configured to:

determine a first angle measurement based on the first output signal from the angle sensor; and determine a second angle measurement based on the first angle measurement, the second output signal from the first incremental sensor, and the third output signal from the second incremental sensor, wherein the second angle measurement has a higher resolution than the first angle measurement.

2. The magnetic sensing system according to claim 1, wherein the plurality of curved segments comprise a plurality of Archimedean spiral segments distributed around the circumference of the magnetic disk.

3. The magnetic sensing system according to claim 1, wherein the number of periods per revolution of the first sinusoidal signal is dependent on the configuration of the first track.

4. The magnetic sensing system according to claim 3, wherein the number of periods per revolution of the first sinusoidal signal is dependent on at least one of: the number of curved segments, the gradient of the curved segments and a distance between the curved segments.

5. The magnetic sensing system according to claim 1, wherein the plurality of curved segments is formed as one of: protrusions, holes, blind holes or indentations.

6. The magnetic sensing system according to claim 1, further comprising at least a third incremental sensor configured to detect changes in the magnetic field influenced by the first track as the rotatable shaft is rotated.

7. The magnetic sensing system according to claim 6, wherein the first incremental sensor and the third incremental sensor are arranged on opposing sides of the first track.

8. The magnetic sensing system according to claim 1, wherein the processing circuit is in further communication with a third incremental sensor configured to generate a fourth output signal and further configured to determine the second angle measurement based on an average of the second output signal and the fourth output signal.

9. The magnetic sensing system according to claim 1, wherein the system comprises a plurality of incremental sensors including the first incremental sensor, the plurality of incremental sensors configured to detect changes in the magnetic field influenced by the first track as the rotatable shaft is rotated, the plurality of incremental sensors being positioned equidistantly around the first track.

10. The magnetic sensing system according to claim 1, wherein the plurality of alternating structures are formed as at least one of: protrusions, holes, blind holes or indentations.

11. The magnetic sensing system according to claim 1, wherein the system further comprises at least a third incremental sensor configured to detect changes in the magnetic field influenced by the second track as the rotatable shaft is rotated.

12. The magnetic sensing system according to claim 1, wherein the angle sensor is one of: an anisotropic magnetoresistive (AMR) based single turn sensor, a giant magnetoresistive (GMR) based single turn sensor, a tunnel magnetoresistive (TMR) based single turn sensor, a Hall effect sensor and an inductive sensor.

13. The magnetic sensing system according to claim 1, wherein the magnetic multi-turn sensor is a giant magnetoresistive (GMR) based multi-turn sensor, or a tunnel magnetoresistive (TMR) based multi-turn sensor.

14. A method of monitoring a position of a rotatable shaft, wherein a magnet and a magnetic disk are mounted on the rotatable shaft, the method comprising:

detecting, using an angle sensor, an orientation of a magnetic field generated by the magnet as the rotatable shaft is rotated;

generating, using the angle sensor, a first output signal comprising a first sinusoidal signal based on the detected orientation of a magnetic field;

detecting, using a first incremental sensor, changes in the magnetic field at the first incremental sensor influenced by the magnetic disk as the rotatable shaft is rotated, wherein the changes are influenced by a first track formed on the magnetic disk due to relative movement of the first incremental sensor and the first track, the first track comprising a plurality of curved segments distributed around the circumference of the magnetic disk;

generating, using the first incremental sensor, a second output signal comprising a second sinusoidal signal based on the detected changes in the magnetic field at the first incremental sensor, the second sinusoidal signal having a greater number of periods per revolution than the first sinusoidal signal;

detecting, using a second incremental sensor, changes in the magnetic field at the second incremental sensor influenced by the magnetic disk as the rotatable shaft is rotated, wherein the changes are influenced by a second track formed on the magnetic disk due to relative movement of the second incremental sensor and the second track, the second track formed from a plurality of alternating structures, the second track introducing periodicity in the magnetic field at the second incremental sensor due to the relative movement of the second incremental sensor and the second track based on the distribution of the plurality of alternating structures around the circumference of the magnetic disk;

generating, using the second incremental sensor, a third output signal comprising a third sinusoidal signal based on the detected changes in the magnetic field at the second incremental sensor, the third sinusoidal signal having more than twice a number of periods per revolution than the second sinusoidal signal;

determining a first angle measurement based on the first output signal from the angle sensor; and determining a second angle measurement based on the first angle measurement, the second output signal from the first incremental sensor, and the third output signal from the second incremental sensor;

wherein the second angle measurement has a higher resolution than the first angle measurement.

15. The method according to claim 14, wherein the plurality of curved segments comprise a plurality of Archimedean spiral segments distributed around the circumference of the magnetic disk.

16. The method according to claim 14, further comprising detecting, using a magnetic multi-turn sensor, a number of turns of the magnetic field generated by the magnet as the rotatable shaft is rotated.

17. A magnetic sensor system, comprising:

a first magnet mounted on a rotatable shaft;

a magnetic sensing device in a vicinity of the first magnet, the magnetic sensing device comprising:

an angle sensor configured to detect an orientation of a magnetic field generated by the first magnet as the rotatable shaft is rotated, the angle sensor configured to generate a first output signal comprising a first sinusoidal signal; and a magnetic multi-turn sensor configured to detect a number of turns of the magnetic field generated by the first magnet as the rotatable shaft is rotated;

at least one bias magnet configured to influence the magnetic field;

a first further magnetic sensor configured to detect changes in the magnetic field influenced by a first magnetic target arranged to be rotated the rotatable shaft due to relative movement of the first further magnetic sensor and the first magnetic target, the first further magnetic sensor configured to generate a second output signal comprising a second sinusoidal signal, the first magnetic target having a first number of features for influencing the magnetic field at the first further magnetic sensor, the second sinusoidal signal having a greater number of periods per revolution than the first sinusoidal signal;

a second further magnetic sensor configured to detect changes in the magnetic field influenced by a second magnetic target due to relative movement of the second further magnetic sensor and the second magnetic target, the second further magnetic sensor configured to generate a third output signal comprising a third sinusoidal signal, the second magnetic target having a plurality of alternating structures for influencing the magnetic field at the second further magnetic sensor, the second magnetic target introducing periodicity in the magnetic field at the second further magnetic sensor due to the relative movement of the second further magnetic sensor and the second magnetic target based on the distribution of the plurality of alternating structures around the second magnetic target, the third sinusoidal signal having more than twice a number of periods per revolution than the second sinusoidal signal; and a processing circuit in communication with the magnetic sensing device and the first further magnetic sensor, the processing circuit being configured to:

determine a first angle measurement based on the first output signal from the angle sensor; and determine a second angle measurement based on the first angle measurement, the second output signal from the first further magnetic sensor, and the third output signal from the second further magnetic sensor, wherein the second angle measurement has a higher resolution than the first angle measurement.

18. The magnetic sensing system according to claim 1, wherein the magnetic disk and the magnet are separately mounted on the rotatable shaft.

19. The magnetic sensing system according to claim 1, wherein the plurality of alternating structures have a different physical structure than the plurality of curved segments.

20. The magnetic sensing system according to claim 19, wherein the plurality of alternating structures comprise spaced holes.

* * * * *